US009741721B2

(12) United States Patent
Park et al.

(10) Patent No.: US 9,741,721 B2
(45) Date of Patent: Aug. 22, 2017

(54) LOW LEAKAGE NON-PLANAR ACCESS TRANSISTOR FOR EMBEDDED DYNAMIC RANDOM ACCESS MEMORY (EDRAM)

(71) Applicant: Intel Corporation, Santa Clara, NC (US)

(72) Inventors: Joodong Park, Portland, OR (US); Gopinath Bhimarasetti, Portland, OR (US); Rahul Ramaswamy, Hillsboro, OR (US); Chia-Hong Jan, Portland, OR (US); Walid M. Hafez, Portland, OR (US); Jeng-Ya D. Yeh, Portland, OR (US); Curtis Tsai, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/912,890

(22) PCT Filed: Sep. 27, 2013

(86) PCT No.: PCT/US2013/062312
§ 371 (c)(1),
(2) Date: Feb. 18, 2016

(87) PCT Pub. No.: WO2015/047315
PCT Pub. Date: Apr. 2, 2015

(65) Prior Publication Data
US 2016/0197082 A1    Jul. 7, 2016

(51) Int. Cl.
*H01L 27/108* (2006.01)
*H01L 29/66* (2006.01)
*H01L 29/78* (2006.01)

(52) U.S. Cl.
CPC .. *H01L 27/10826* (2013.01); *H01L 27/10808* (2013.01); *H01L 27/10879* (2013.01);
(Continued)

(58) Field of Classification Search
CPC ......... H01L 27/10826; H01L 27/10808; H01L 27/10879; H01L 29/66545; H01L 29/66795; H01L 29/7854
See application file for complete search history.

(56) References Cited

U.S. PATENT DOCUMENTS

| 6,764,884 B1 | 7/2004 | Yu et al. |
| 9,548,367 B2 * | 1/2017 | Lee ................... H01L 29/41791 |

(Continued)

FOREIGN PATENT DOCUMENTS

| JP | 2007518270 | 7/2007 |
| TW | 200425425 | 2/2011 |

OTHER PUBLICATIONS

International Search Report and Written Opinion from PCT/US2013/062312 mailed Jun. 10, 2014, 13 pgs.
(Continued)

*Primary Examiner* — Karen Kusumakar
(74) *Attorney, Agent, or Firm* — Schwabe, Williamson & Wyatt P.C.

(57) ABSTRACT

Low leakage non-planar access transistors for embedded dynamic random access memory (eDRAM) and methods of fabricating low leakage non-planar access transistors for eDRAM are described. For example, a semiconductor device includes a semiconductor fin disposed above a substrate and including a narrow fin region disposed between two wide fin regions. A gate electrode stack is disposed conformal with the narrow fin region of the semiconductor fin, the gate electrode stack including a gate electrode disposed on a gate dielectric layer. The gate dielectric layer includes a lower layer and an upper layer, the lower layer composed of an oxide of the semiconductor fin. A pair of
(Continued)

source/drain regions is included, each of the source/drain regions disposed in a corresponding one of the wide fin regions.

18 Claims, 8 Drawing Sheets

(52) U.S. Cl.
CPC .. *H01L 29/66545* (2013.01); *H01L 29/66795* (2013.01); *H01L 29/7854* (2013.01)

(56) References Cited

U.S. PATENT DOCUMENTS

| | | | | |
|---|---|---|---|---|
| 2003/0151077 | A1* | 8/2003 | Mathew | H01L 29/785 257/250 |
| 2005/0095793 | A1* | 5/2005 | Lee | H01L 29/41791 438/294 |
| 2005/0153492 | A1* | 7/2005 | Ahmed | H01L 29/66545 438/183 |
| 2007/0004146 | A1 | 1/2007 | Prinz et al. | |
| 2007/0026615 | A1 | 2/2007 | Goktepeli et al. | |
| 2008/0084731 | A1* | 4/2008 | Lee | G11C 11/404 365/149 |
| 2008/0242012 | A1 | 10/2008 | Pae et al. | |
| 2009/0200616 | A1* | 8/2009 | Shimizu | H01L 21/82384 257/369 |
| 2011/0260255 | A1 | 10/2011 | Wang et al. | |
| 2012/0139062 | A1 | 6/2012 | Yuan et al. | |
| 2013/0082304 | A1 | 4/2013 | Liu et al. | |
| 2013/0200455 | A1 | 8/2013 | Lo et al. | |
| 2013/0200470 | A1 | 8/2013 | Liu et al. | |

OTHER PUBLICATIONS

International Preliminary Report on Patentability for Application No. PCT/US2013/062312, mailed Apr. 7, 2016.
Taiwanese Office Action for Application No. 103132258, dated May 16, 2016.
Taiwanese Office Action for Application No. 103132258 dated Dec. 14, 2016.
Extended European Search Report for European Patent Application No. 13894350.1 mailed Apr. 10, 2017, 9 pgs.
Second Non-Final Office Action for Taiwanese Patent Application No. 103132258, mailed Dec. 12, 2016, 4 pgs., with English translation.

* cited by examiner

LOW LEAKAGE NON-PLANAR ACCESS TRANSISTOR FOR EMBEDDED DYNAMIC RANDOM ACCESS MEMORY (EDRAM)

CLAIM OF PRIORITY

This application is a U.S. National Phase application under 35 U.S.C. §371 of International Application No. PCT/US2013/062312, filed Sep. 27, 2013, entitled "LOW LEAKAGE NON-PLANAR ACCESS TRANSISTOR FOR EMBEDDED DYNAMIC RANDOM ACCESS MEMORY (EDRAM)" the entire contents of which are incorporated herein by reference.

TECHNICAL FIELD

Embodiments of the invention are in the field of semiconductor devices and processing and, in particular, low leakage non-planar access transistors for embedded dynamic random access memory (eDRAM) and methods of fabricating low leakage non-planar access transistors for eDRAM.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin field effect transistors (fin-FETs), have become more prevalent as device dimensions continue to scale down. In conventional processes, fin-FETs are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIGS. 3A-3D illustrate cross-sectional views of various operations in a method of fabricating a low leakage non-planar access transistor, in accordance with an embodiment of the present invention, where:

DESCRIPTION OF THE EMBODIMENTS

Low leakage non-planar access transistors for embedded dynamic random access memory (eDRAM) and methods of fabricating low leakage non-planar access transistors for eDRAM are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to approaches to fabricating extremely low leakage tri-gate eDRAM access transistors with differential fin widths. Embodiments may include one or more of a fin-FET device, gate induced drain leakage reduction, junction leakage reduction, low-leakage, low-power, metal oxide semiconductor field effect transistors (MOSFETs), selective oxidation approaches, system-on-chip products, and tri-gate technologies. The transistors described herein may be useful for eDRAM technology, but need not be so limited in application.

To provide context, one or more embodiments described herein address problem of gate-induced drain leakage (GIDL) current which is one of the major leakage paths in state-of-the-art memory cells. One or more embodiments are directed to the use of fin-FET devices as suitable for addressing GIDL issues due to superior channel controllability. GIDL is induced by a high electric field between gate and drain and it is seriously deteriorated in a fin-FET structure due to due to a lateral bipolar junction effect. Previous solutions that have addressed mitigation of GIDL current have included junction grading, co-implant optimization, and oxide thickness control. For fin-FET devices with scaled gate dimensions, however, GIDL leakage may not effectively be mitigated by such approaches since performance and sub-threshold (off-state) leakage significantly degrades. Accordingly, in an embodiment, a transistor with differential fin width is described herein. In one such embodiment, the device enables precise control of GIDL leakage and is fully compatible with a standard fin-FET complimentary metal oxide semiconductor (CMOS) process flow.

More specifically, one or more embodiments are directed to fabrication of an eDRAM access transistor. For such a transistor, a thicker gate dielectric may be favored to minimize GIDL current. However, a thicker gate dielectric also produces narrower fin dimensions at source/drain regions (e.g., outside of the channel regions) and can degrade performance due to higher series resistance (Rext). Instead, in accordance with an embodiment of the present invention, fin width is differentiated under the channel without impacting fin width at source/drain regions. In one such embodiment, fin width differentiation is achieved with a selective oxidation process. To reduce a gate-drain field, conventional approaches introduce a thicker gate dielectric prior to a gate electrode formation. Such conventional approaches may be used to reduce GIDL current; however, simultaneously, drive current (Ion) is degraded since fin width at source/drain is also reduced as a result of the thicker gate dielectric. The result can be an unwanted increase in parasitic series resistance (Rext). In accordance with an embodiment of the present invention, then, a selective oxidation process is used to effectively differentiate fin width under the channel without impacting fin width at source/drain regions.

Figure 1A:
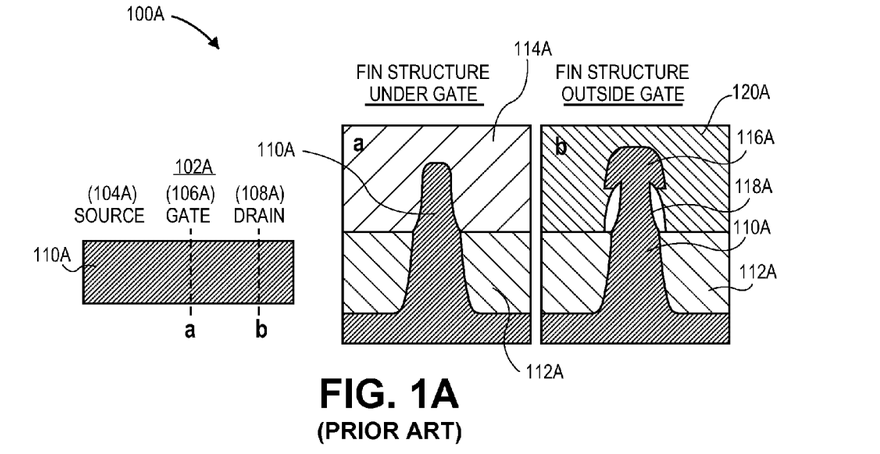
FIG. 1A illustrates a plan view and corresponding cross-sectional views of a state-of-the-art non-planar access transistor.

For the sake of comparison, conventional approaches to addressing GIDL can be understood from a structural vantage point. In a first example, FIG. 1A illustrates a plan view and corresponding cross-sectional views of a state-of-the-art non-planar access transistor 100A. Referring to FIG. 1A, a plan view 102A of a device highlights source 104A, gate 106A and drain 108A regions of a fin 110A. As taken along the gate region cross-section (a), the fin 110A protrudes above an isolation region 112A. A gate electrode stack 114A is disposed over the protruding portion of the fin 110A. As taken along the drain region cross-section (b), the fin 110A having an epitaxial region 116A protrudes above the isolation region 112A, and may include spacer portions 118A. A contact 120A is disposed over the protruding portion of the fin 110A. In this first example, relatively full (wide) fin widths are maintained. However, a corresponding gate dielectric of the gate stack 114A is relatively since little to no fin consumption is performed to form the gate dielectric layer. Thus, the device 100A may not be suitably low leakage for effective access transistor performance, e.g., for an eDRAM cell.

Figure 1B:
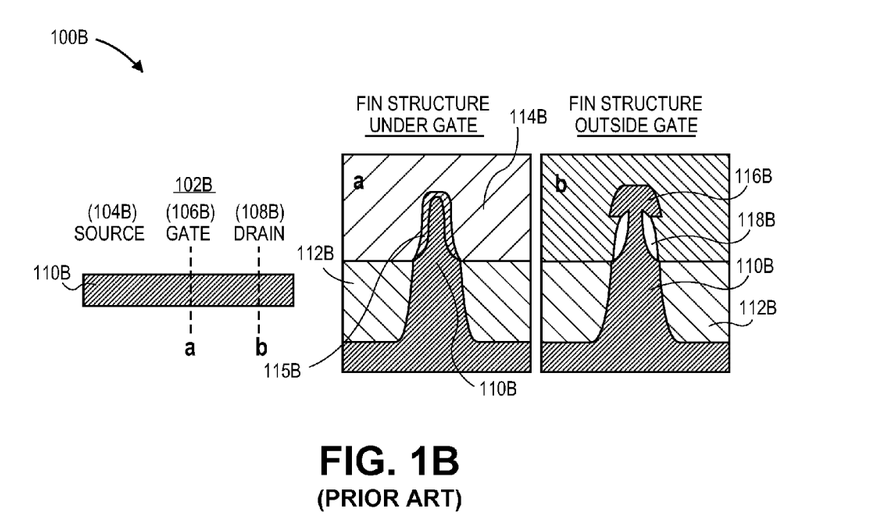
FIG. 1B illustrates a plan view and corresponding cross-sectional views of another state-of-the-art non-planar access transistor.

In a second example, FIG. 1B illustrates a plan view and corresponding cross-sectional views of another state-of-the-art non-planar access transistor. Referring to FIG. 1B, a plan view 102B of a device highlights source 104B, gate 106B and drain 108B regions of a fin 110B. As taken along the gate region cross-section (a), the fin 110B protrudes above an isolation region 112B. A gate electrode stack 114B is disposed over the protruding portion of the fin 110B. The gate electrode stack 114B includes a gate dielectric that at least includes a consumed (oxidized) region 115B of the fin 110B. As taken along the drain region cross-section (b), the fin 110B having an epitaxial region 116B protrudes above the isolation region 112B, and may include spacer portions 118B. A contact 120B is disposed over the protruding portion of the fin 110B. In this second example, relatively narrow (thin) fin widths result in both the gate and source/drain regions of the fin 110B due to consumption of a portion of the fin 110B. It is to be understood that the consumed portion of the fin 110B in the source/drain regions is removed prior to epitaxial growth on the fin in those regions. Thus, the device 100B may have Rext issues and may not be suitably high performance for effective access transistor performance, e.g., for an eDRAM cell.

In accordance with an embodiment of the present invention, a selective oxidation is performed following poly or other dummy removal during a replacement gate process, e.g., during which time the portion of the fin under the gate is exposed. As such, thick gate dielectric may be fabricated without impact regions of the fin outside the gate structures. As an example, in contrast to the arrangements described in association with FIGS. 1A and 1B, FIG. 2A illustrates a plan view and corresponding cross-sectional views of a low leakage non-planar access transistor 200; and FIG. 2B illustrates an angled view of a portion of the low leakage non-planar access transistor 200 of FIG. 2A, in accordance with an embodiment of the present invention.

Figure 2A:
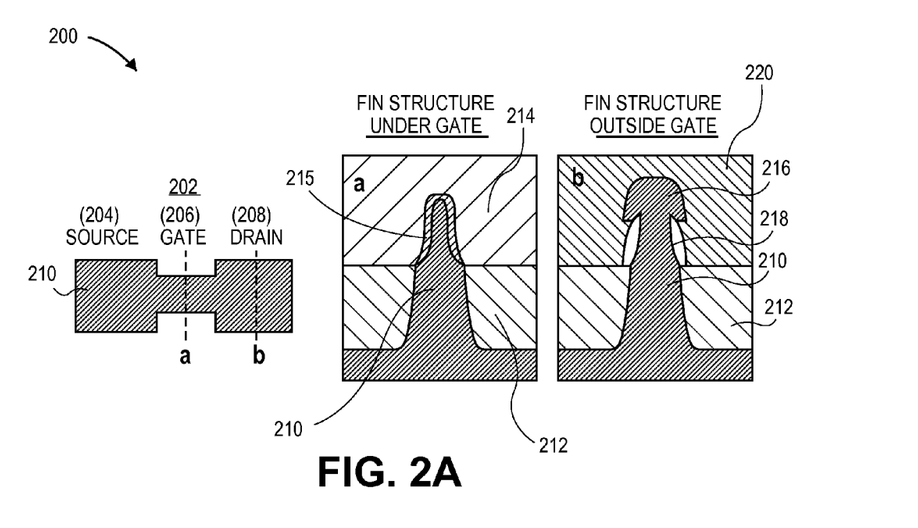
FIG. 2A illustrates a plan view and corresponding cross-sectional views of a low leakage non-planar access transistor, in accordance with an embodiment of the present invention.
Figure 2B:
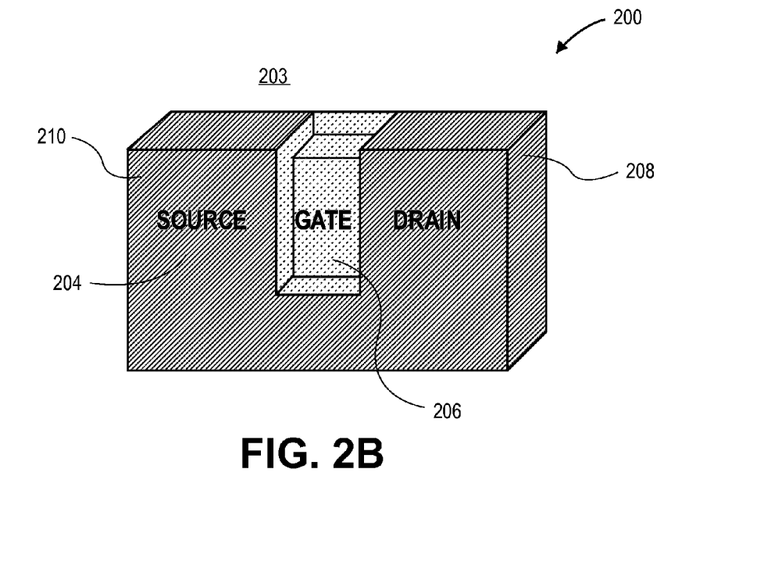
FIG. 2B illustrates an angled view of a portion of the low leakage non-planar access transistor of FIG. 2A, in accordance with an embodiment of the present invention.

Referring to FIGS. 2A and 2B, a plan view 202 and angled view 203 of a device 200 highlights source 204, gate 206 and drain 208 regions of a fin 210. As taken along the gate region cross-section (a), the fin 210 protrudes above an isolation region 212. A gate electrode stack 214 is disposed over the protruding portion of the fin 210. The gate electrode stack 214 includes a gate dielectric that at least includes a consumed (oxidized) region 215 of the fin 210. As taken along the drain region cross-section (b), the fin 210 having an epitaxial region 216 protrudes above the isolation region 212, and may include spacer portions 218. A contact 220 is disposed over the protruding portion of the fin 210. As seen in cross-section (a) of FIG. 2A, relatively narrow (thin) fin widths result in the gate region of the fin 210 due to consumption of a portion of the fin 210. However, relatively full (wide) fin widths are maintained in the source/drain regions of the fin 210 since the fin consumption is confined to the gate regions of the fin 210. As can be seen in FIG. 2B, in an embodiment, a narrower portion of a fin not only refers to a narrower from a plan view perspective (as seen in FIG. 2A), but also refers to a recess in height relative to the relatively wider portions of the fin. Overall, in an embodiment, a thick dielectric layer is achieved in the gate region for leakage reduction while wider fin portions are maintained in the source/drain regions for Rext reduction. Thus, the device 200 may have reduced Rext issues and may be suitably high performance for effective access transistor performance, e.g., for an eDRAM cell. It is to be understood that additional processing can subsequently be performed to complete the device of FIGS. 2A and 2B, such as contact formation and back-end of line (BEOL) interconnect fabrication. It is also to be understood that, although not depicted.

In another aspect, as mentioned briefly above, a semiconductor fabrication scheme involves introduction of a selective dry oxidation process following placeholder polysilicon gate removal (PYREM) where the gate dielectric is exposed. Since the selective dry oxidation is controlled by process variables such as temperature, pressure, gas flow rate, etc., thickness of transition layer (e.g., fin width under the channel) can be defined with high control. As an example, FIGS. 3A-3D illustrate cross-sectional views of various operations in a method of fabricating a low leakage non-planar access transistor, in accordance with an embodiment of the present invention.

Figure 3A:
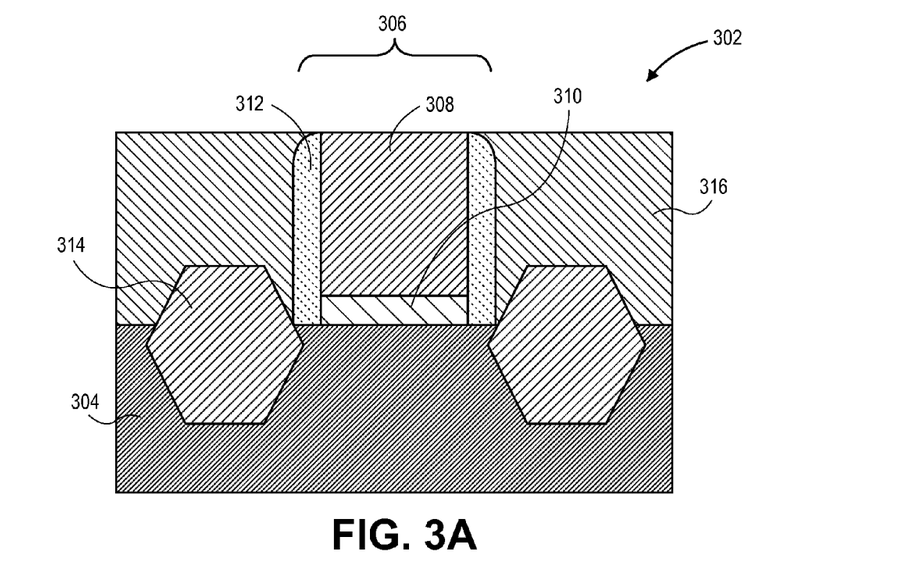
FIG. 3A illustrates a starting structure for semiconductor device fabrication.

Referring to FIG. 3A, a starting structure 302 for semiconductor device fabrication includes a semiconductor fin 304 disposed above a substrate, such as a bulk semiconductor substrate (not shown). A dummy gate stack 306 is disposed above the fin 304 and includes a dummy gate electrode 308 and partial or dummy gate dielectric layer 310. Spacers 312 are disposed adjacent to the sidewalls of the dummy gate stack 306. Epitaxial source/drain regions 314 are disposed in, and partially protrude from, the semiconductor fin 304. An isolation layer 316, such as an inter-layer dielectric layer, is also shown. It is to be appreciated that, in a three-dimensional consideration, the dummy gate stack 306 is formed on both the top (as shown) and sidewall portions of the fin 304.

Figure 3B:
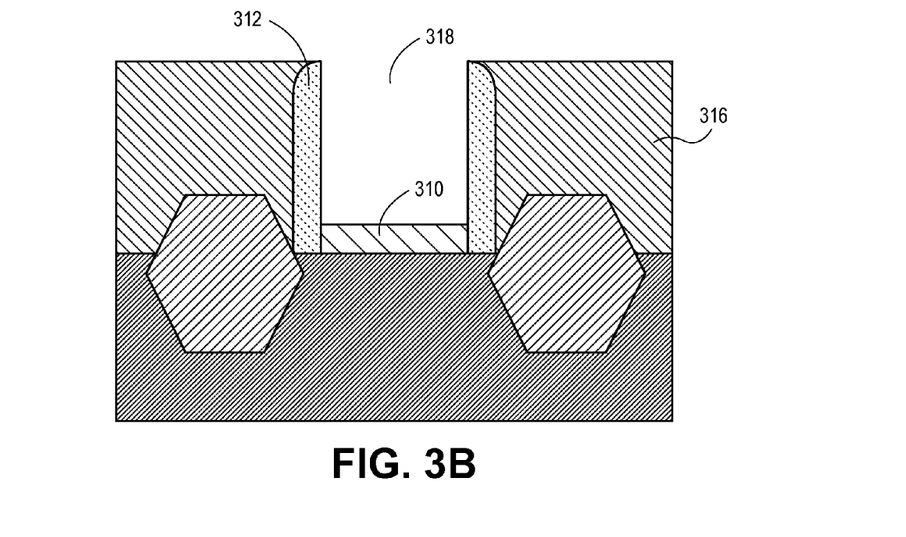
FIG. 3B illustrates the structure of FIG. 3A following removal of the dummy gate electrode to form a trench.

Referring to FIG. 3B, the dummy gate electrode 308 is removed from the structure of FIG. 3A to form a trench 318, in order to initiate a replacement gate process. As shown in FIG. 3B, the removal of the dummy gate electrode 308 is performed with selectivity to the partial or dummy gate dielectric layer 310, which is retained at this stage.

Figure 3C:
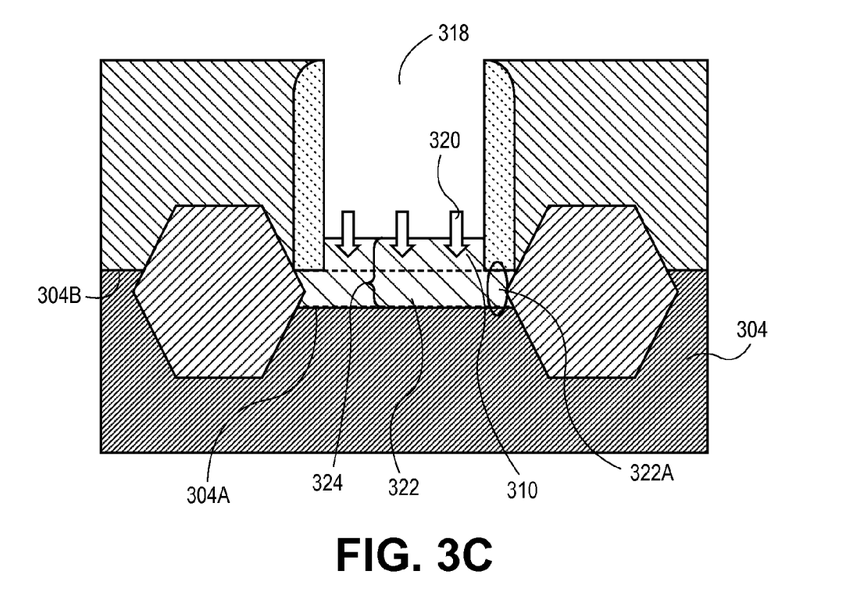
FIG. 3C illustrates the structure of FIG. 3B following an oxidation process.

Referring to FIG. 3C, an oxidation process 320 is performed on the structure of FIG. 3C. The oxidation process 320 penetrates the partial or dummy gate dielectric layer 310 and consumed a portion of the semiconductor fin 304 to form an oxide layer 322, which may referred to as a transition layer. The consumption of fin 304 is restricted to regions exposed by the trench 318 of the removed dummy gate electrode 308. As such, the resulting oxide layer 322 is substantially confined to the gate region (i.e., channel region) of the fin 304. The resulting fin 304, then, has wider regions 304B outside of the gate region, and has a narrower region 304A in the gate region. Referring again to FIG. 3C, the oxide layer 322 can be formed to extend under the spacers 312. Thus, the consumption may not be precisely confines to the gate region, but is at least substantially confined to the gate region. In an embodiment, the fin is composed of silicon, and the consumption process involves the formation of a silicon oxide.

With reference again to FIG. 3C, the oxidation process 320 is, in one embodiment, performed in the presence of the partial or dummy gate dielectric layer 310. In such a case, the layer 310 is a partial dielectric layer in that it is retained in the final, thick, gate dielectric layer 324 along with the oxide layer 322. In one such embodiment, the retained partial dielectric layer is composed of an oxide of silicon and is formed in an initial fin oxidation process performed much earlier in the fabrication process flow. In another embodiment, however, the layer 310 is a dummy gate dielectric layer and is removed following removal of the dummy gate electrode 308. In that embodiment, a replacement gate dielectric layer, e.g., a high-k gate dielectric layer, is then formed. Subsequently, the oxidation process 320 is performed in the presence of such a replacement gate dielectric layer to provide a final, thick dielectric layer that includes the replacement gate dielectric layer along in addition to the formed oxide layer 322.

Referring again to FIG. 3C, in an embodiment, the oxidation process 320 is a dry oxidation process. In one embodiment, the dry oxidation process involves use of ambient hydrogen and oxygen at a temperature approximately in the range of 500-700 degrees Celsius and a pressure approximately in the range of 3-10 Torr. Oxidation thickness may be controlled within tens to hundreds of Angstroms.

Figure 3D:
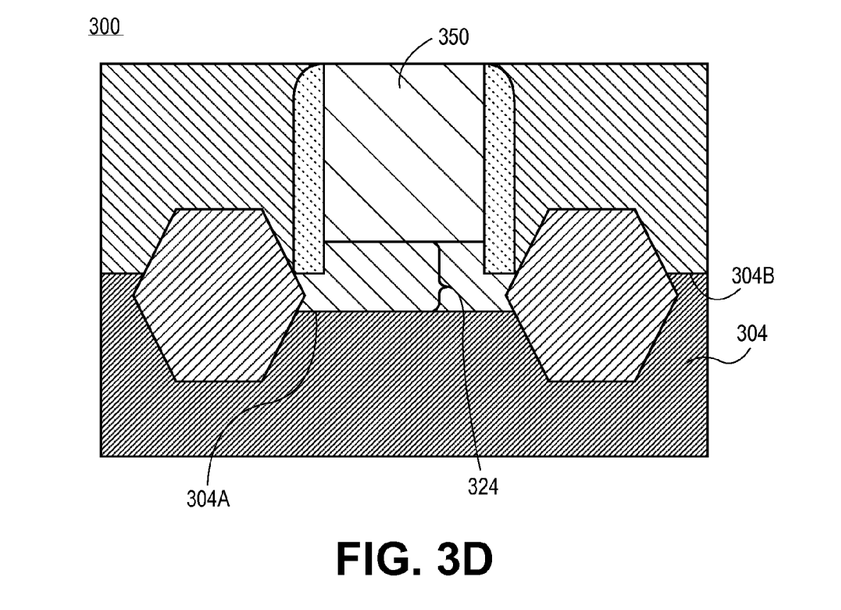
FIG. 3D illustrates the structure of FIG. 3C following metal gate electrode formation on the on the thick gate dielectric layer of FIG. 3C.

Referring to FIG. 3D, a metal gate electrode 350 is formed in the trench 318 and on the thick gate dielectric layer 324 of FIG. 3C, providing a permanent gate stack for a fabricated semiconductor device 300. Thus, for the resulting semiconductor device 300, gate regions of a fin portion are fabricated to include a thicker gate dielectric (and resulting in thinner fin width due to silicon consumption) for lower leakage. On the other hand, source and drain regions of a fin portion are not subjected to the same fin consumption, resulting in relatively wider fin portions in those regions and leading to a reduction in Rext relative to source and drain regions otherwise subjected to fin consumption. It is to be appreciated that additional processing can subsequently be performed to complete the device 300 of FIG. 3D, such as contact formation and back-end of line (BEOL) interconnect fabrication.

Figure 4A:
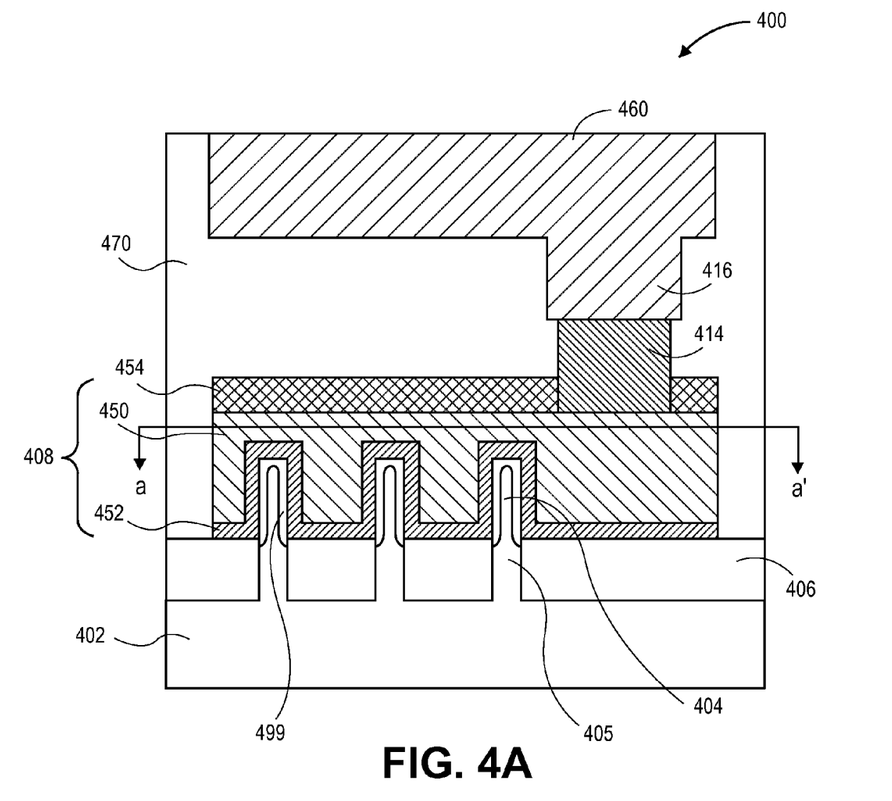
FIG. 4A illustrates a cross-sectional view of a non-planar semiconductor device, in accordance with an embodiment of the present invention.
Figure 4B:
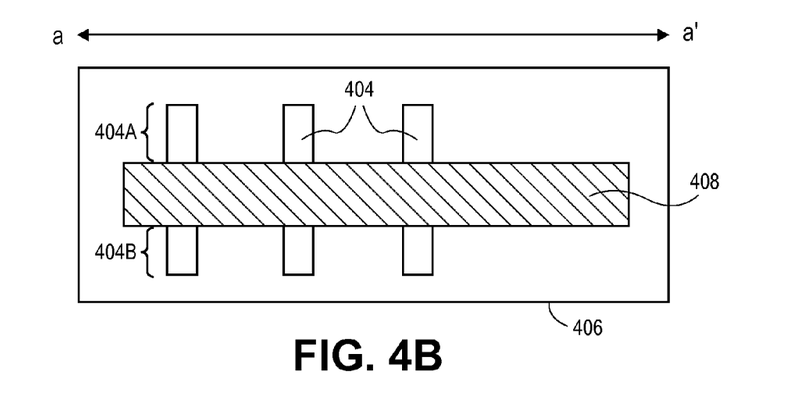
FIG. 4B illustrates a plan view taken along the a-a' axis of the semiconductor device of FIG. 4A, in accordance with an embodiment of the present invention.

In general, referring again to FIGS. 3A-3D, in an embodiment, the approach described can be used for N-type (e.g., NMOS) or P-type (e.g., PMOS), or both, device fabrication. It is to be understood that the structures resulting from the above exemplary processing scheme, e.g., the structures from FIG. 3D, may be used in a same or similar form for subsequent processing operations to complete device fabrication, such as PMOS and NMOS device fabrication. As an example of a completed device, FIGS. 4A and 4B illustrate a cross-sectional view and a plan view (taken along the a-a' axis of the cross-sectional view), respectively, of a non-planar semiconductor device such as completed versions of the low leakage non-planar access transistor 200 or 300, in accordance with an embodiment of the present invention. It is to be noted that the cross-sectional view of FIG. 4A is taken orthogonal to the cross-sectional view of FIG. 3D, as taken along the gate line 350. Furthermore, in the example, illustrated in FIGS. 4A and 4B, the gate line covers three distinct semiconductor fins.

Referring to FIG. 4A, a semiconductor structure or device 400, such as completed versions of a low leakage non-planar access transistor, includes a non-planar active region (e.g., a fin structure including a protruding fin portion 404 and a sub-fin region 405) formed from a substrate 402, and within an isolation region 406.

Referring again to FIG. 4A, a gate line 408 is disposed over the protruding portions 404 of the non-planar active region as well as over a portion of the isolation region 406. As shown, gate line 408 includes a gate electrode 450 and a gate dielectric layer 452. A consumed (oxidized) portion 499 of the protruding portions 404 of the non-planar active region is substantially confined to the gate region, e.g., the region below gate line 408. The total, thick, gate dielectric layer includes both the dielectric layer 452 and the consumed (oxidized) portion 499. In one embodiment, gate line 408 may also include a dielectric cap layer 454. A gate contact 414, and overlying gate contact via 416 are also seen from this perspective, along with an overlying metal interconnect 460, all of which are disposed in inter-layer dielectric stacks or layers 470. Also seen from the perspective of FIG. 4A, the gate contact 414 is, in one embodiment, disposed over isolation region 406, but not over the non-planar active regions. As shown, the fins 404 are considered to be bulk fins since they extend from the underlying substrate 402. In other embodiments, the fins are formed from a silicon-on insulator (SOI) type substrate and are thus disposed on a global insulator layer.

Referring to FIG. 4B, the gate line 408 is shown as disposed over the protruding fin portions 404. Source and drain regions 404A and 404B of the protruding fin portions 404 can be seen from this perspective. In one embodiment, the source and drain regions 404A and 404B are doped portions of original material of the protruding fin portions 404. In another embodiment, as described above, the material of the protruding fin portions 404 is removed and replaced with another semiconductor material, e.g., by epitaxial deposition. In either case, the source and drain regions 404A and 404B may extend below the height of dielectric layer 406, i.e., into the sub-fin region 405, in the case of bulk type devices. Alternatively, the source and drain regions 404A and 404B do not extend below the height of dielectric layer 406, and are either above or co-planar with the height of dielectric layer 406.

In an embodiment, the semiconductor structure or device 400 is a non-planar device such as, but not limited to, a fin-FET or a tri-gate or similar device. In such an embodiment, a corresponding semiconducting channel region is composed of or is formed in a three-dimensional body. In one such embodiment, the gate electrode stacks of gate lines 408 surround at least a top surface and a pair of sidewalls of the three-dimensional body, as depicted in FIG. 4A.

Substrate 402 may be composed of a semiconductor material that can withstand a manufacturing process and in which charge can migrate. In an embodiment, substrate 402 is a bulk substrate composed of a crystalline silicon, silicon/germanium or germanium layer doped with a charge carrier, such as but not limited to phosphorus, arsenic, boron or a combination thereof. In one embodiment, the concentration of silicon atoms in bulk substrate 402 is greater than 97%. In another embodiment, bulk substrate 402 is composed of an epitaxial layer grown atop a distinct crystalline substrate, e.g. a silicon epitaxial layer grown atop a boron-doped bulk silicon mono-crystalline substrate. Bulk substrate 402 may alternatively be composed of a group III-V material. In an embodiment, bulk substrate 402 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 402 is composed of a III-V material and the charge-carrier dopant impurity atoms are ones such as, but not limited to, carbon, silicon, germanium, oxygen, sulfur, selenium or tellurium. Alternatively, in place of a bulk substrate, a silicon-on-insulator (SOI) substrate may be used.

Isolation region 406 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 406 is composed of a dielectric material such as, but not limited to, silicon dioxide, silicon oxy-nitride, silicon nitride, or carbon-doped silicon nitride.

Gate line 408 may be composed of a gate electrode stack which includes a gate dielectric layer 452 and a gate electrode layer 450. As mentioned above, a consumed (oxidized) portion 499 of the protruding portions 404 of the non-planar active region is substantially confined to the gate region, e.g., the region below gate line 408. A total, thick, gate dielectric layer includes both the dielectric layer 452 and the consumed (oxidized) portion 499. In an embodiment, the oxidized portion is composed of a silicon dioxide resulting from oxidation of a silicon non-planar active region. In an embodiment, the gate dielectric layer 452 is a conformal layer, e.g., as formed in a replacement gate dielectric process, as shown. In one such embodiment, the gate dielectric layer 452 is composed of a high-K material. For example, in one embodiment, the gate dielectric layer 452 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In another embodiment, however, as was illustrated in FIG. 3C, an initial gate dielectric layer formed from oxidation is not replaced and a total, thick, gate dielectric layer includes both the retained initial gate dielectric layer and the consumed (oxidized) portion 499.

In one embodiment, the gate electrode layer 450 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks (as shown in FIGS. 3A-3D) may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 414 and overlying gate contact via 416 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment, the gate line 408 is first formed by poly gate patterning involving poly lithography to define the poly gate by etch of an SiN hardmask and poly subsequently. In one embodiment, a mask is formed on the hardmask layer, the mask composed of a topographic masking portion and an anti-reflective coating (ARC) layer. In a particular such embodiment, the topographic masking portion is a carbon hardmask (CHM) layer and the anti-reflective coating layer is a silicon ARC layer. The topographic masking portion and the ARC layer may be patterned with conventional lithography and etching process techniques. In one embodiment, the mask also includes and uppermost photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

Furthermore, as mentioned briefly in association with FIGS. 3B and 3D, the gate stack structure 408 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius.

Referring again to FIG. 4A, the arrangement of semiconductor structure or device 400 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor field effect transistors (MOS) transistors for logic or memory, or are bipolar transistors. Also, in an embodiment, the semiconductor devices have a three-dimensional architecture, such as a fin-FET device, a trigate device, or an independently accessed double gate device. One or more embodiments may be particularly useful for devices included in a system-on-chip (SoC) product. Additionally, it is to be understood that the processing scheme described in association with FIGS. 3A-3D could also be applicable to planar device fabrication.

One or more embodiments described herein may have applications for low power SoC/memory designers attempting to minimize junction leakage, particularly in cellphone, tablet, netbook, and embedded memory segments. In one or more embodiments, cross-sectional TEM imaging will clearly reveal the unique transistor architecture of differential fin width. Such devices may be used to provide a higher resistance path, thereby mitigating GIDL leakage. One or more embodiments are directed to three-dimensional tri-gate technology and is implemented for further lowering leakage while maintaining outstanding performance on embedded DRAM products, e.g., suitable for the SoC market.

More generally, with reference to DRAM applications, in semiconductor devices such as DRAMs, each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. However, challenges are presented in formulating practical manufacturing processes due to the ever increasing high level of integration of semiconductor devices. Furthermore, challenges are presented in fabricating a suitable low leakage access transistor associated with such capacitors.

In another aspect, a low leakage non-planar access transistor, such as a non-planar device described above, is associated with an embedded metal-insulator-metal (MIM) capacitor included in a dielectric layer of a metal wiring. For example, FIG. 5 illustrates a cross-sectional view of a low leakage non-planar access transistor and corresponding capacitor formed in a single dielectric layer housing fourth-level metal wiring, in accordance with an embodiment of the present invention.

Figure 5:
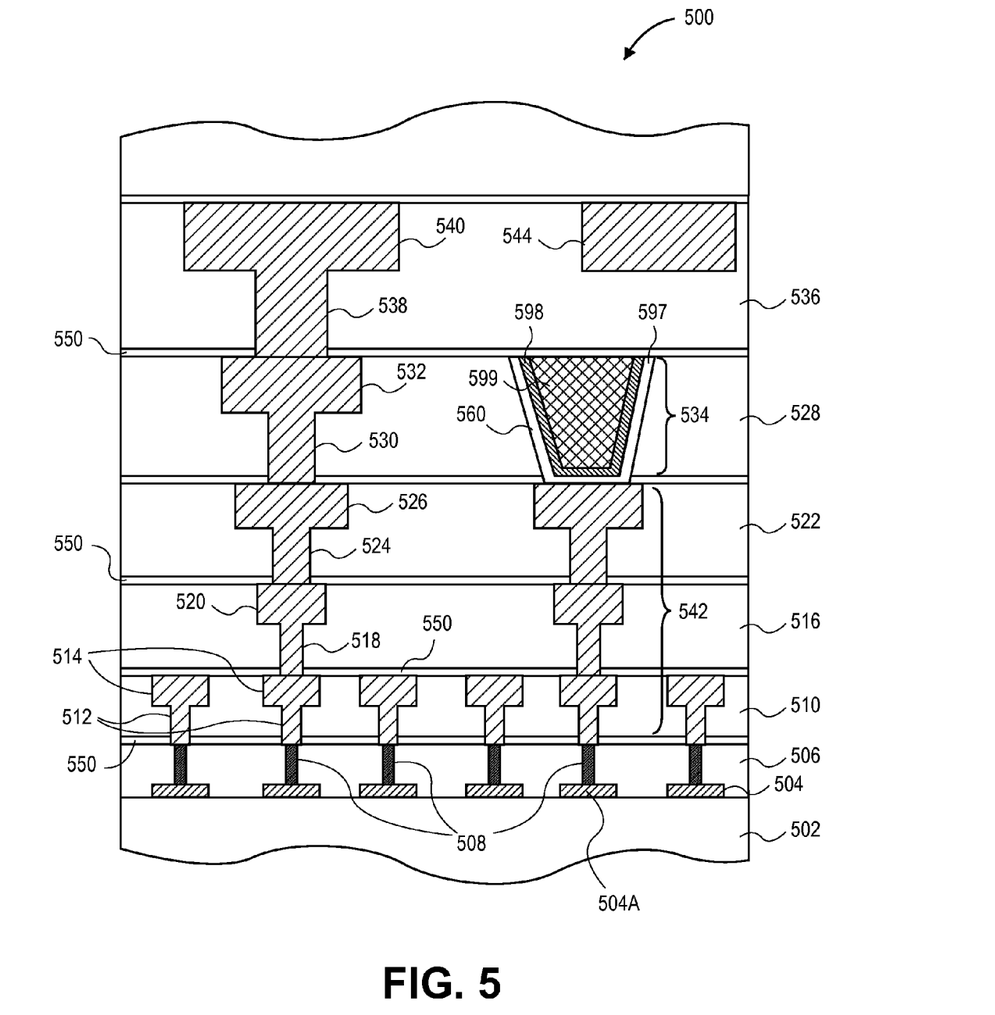
FIG. 5 illustrates a cross-sectional view of a low leakage non-planar access transistor and corresponding capacitor formed in a single dielectric layer housing fourth-level metal wiring, in accordance with an embodiment of the present invention.

Referring to FIG. 5, a semiconductor structure 500 includes a plurality of semiconductor devices 504 disposed in or above a substrate 502. In one embodiment, one such device 504A is a low leakage non-planar access transistor for an eDRAM cell, such as the access transistors described above. A first dielectric layer 506 is disposed above the plurality of semiconductor devices 504 and has disposed therein contacts 508 electrically coupled to the plurality of semiconductor devices 504.

A second dielectric layer 510 is disposed above the first dielectric layer 506 and has disposed therein a first metal wiring 514 and one or more vias 512 coupling the first metal wiring 514 to the contacts 508. A third dielectric layer 516 is disposed above the second dielectric layer 510 and has disposed therein a second metal wiring 520 and one or more vias 518 coupling the second metal wiring 520 to the first metal wiring 514. A fourth dielectric layer 522 is disposed above the third dielectric layer 516 and has disposed therein a third metal wiring 526 and one or more vias 524 coupling the third metal wiring 526 to the second metal wiring 520. A fifth dielectric layer 528 is disposed above the fourth dielectric layer 522 and has disposed therein a fourth metal wiring 532 and one or more vias 530 coupling the fourth metal wiring 532 to the third metal wiring 526.

Fifth dielectric layer 528 also has disposed therein at least a portion of a metal-insulator-metal (MIM) capacitor 534. The MIM capacitor 534 is adjacent to the fourth metal wiring 532. The MIM capacitor is electrically coupled to one or more of the semiconductor devices 504, e.g., by a stack 542 of metal wirings and vias and through to a contact 508. A sixth dielectric layer 536 is disposed above the fifth dielectric layer 528 and has disposed therein a fifth metal wiring 540 and one or more vias 538 coupling the fifth metal wiring 540 to the fourth metal wiring 532. In an embodiment, the MIM capacitor 534 is disposed in the fifth dielectric layer 528, but not the fourth or sixth dielectric layers 522 or 336, respectively, as is depicted in FIG. 5. As is also depicted in FIG. 5, a metal wiring 544 may be disposed above the MIM capacitor 534, but need not be coupled with the MIM capacitor 534.

Figure 6:
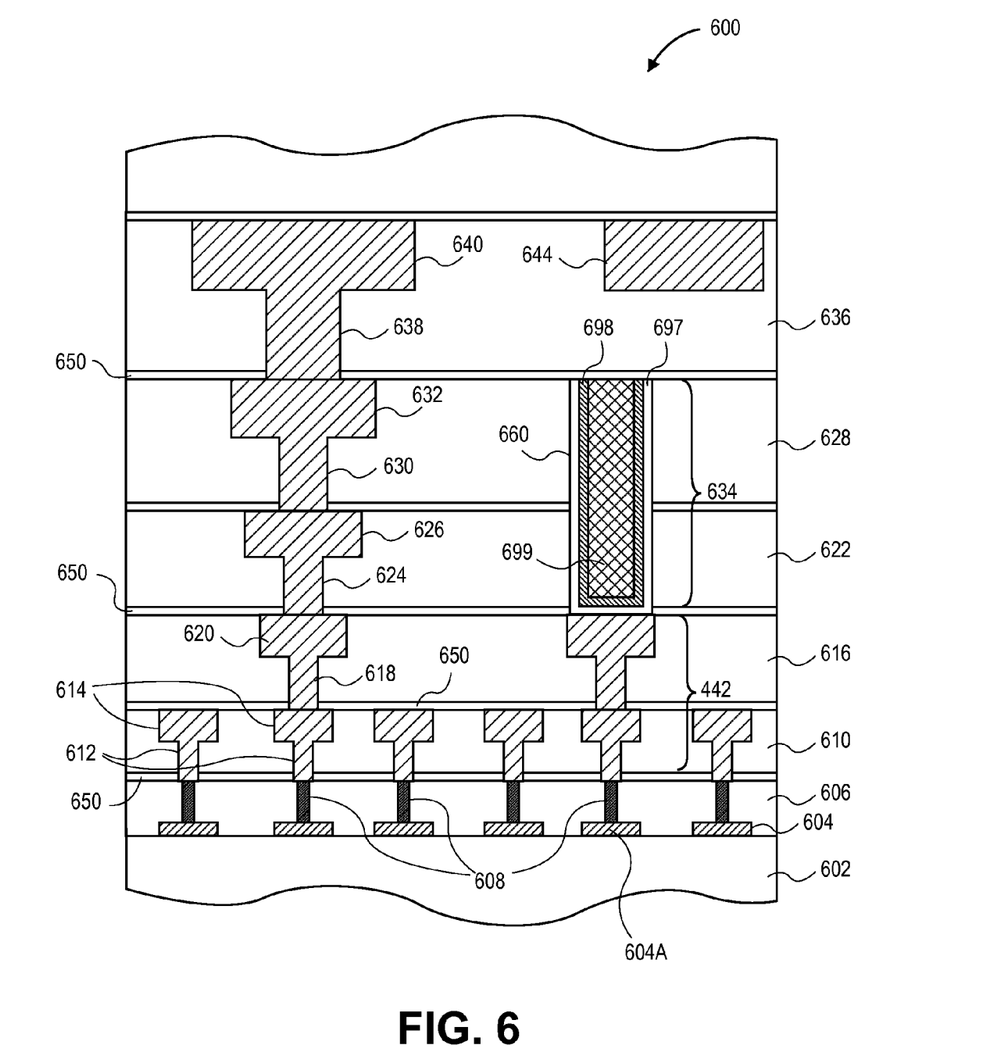
FIG. 6 illustrates a cross-sectional view of a low leakage non-planar access transistor and corresponding capacitor formed in the two dielectric layers housing third-level and fourth-level metal wiring, in accordance with an embodiment of the present invention.

In another example, FIG. 6 illustrates a cross-sectional view of a low leakage non-planar access transistor and corresponding capacitor formed in the two dielectric layers housing third-level and fourth-level metal wiring, in accordance with an embodiment of the present invention.

Referring to FIG. 6, a semiconductor structure 600 includes a plurality of semiconductor devices 604 disposed in or above a substrate 602. In one embodiment, one such device 604A is a low leakage non-planar access transistor for an eDRAM cell, such as the access transistors described above. A first dielectric layer 606 is disposed above the plurality of semiconductor devices 604 and has disposed therein contacts 608 electrically coupled to the plurality of semiconductor devices 604.

A second dielectric layer 610 is disposed above the first dielectric layer 606 and has disposed therein a first metal wiring 614 and one or more vias 612 coupling the first metal wiring 614 to the contacts 608. A third dielectric layer 616 is disposed above the second dielectric layer 610 and has disposed therein a second metal wiring 620 and one or more vias 618 coupling the second metal wiring 620 to the first metal wiring 614. A fourth dielectric layer 622 is disposed above the third dielectric layer 616 and has disposed therein a third metal wiring 626 and one or more vias 624 coupling the third metal wiring 626 to the second metal wiring 620. A fifth dielectric layer 628 is disposed above the fourth dielectric layer 622 and has disposed therein a fourth metal wiring 632 and one or more vias 630 coupling the fourth metal wiring 632 to the third metal wiring 626.

Fifth dielectric layer 628 also has disposed therein at least a portion of a metal-insulator-metal (MIM) capacitor 634. The MIM capacitor 634 is adjacent to the fourth metal wiring 632. The MIM capacitor is electrically coupled to one or more of the semiconductor devices 604, e.g., by a stack 642 of metal wirings and vias and through to a contact 608. A sixth dielectric layer 636 is disposed above the fifth dielectric layer 628 and has disposed therein a fifth metal wiring 640 and one or more vias 638 coupling the fifth metal wiring 640 to the fourth metal wiring 632. In an embodiment, another portion of the MIM capacitor 634 is disposed in the fourth dielectric layer 622, adjacent to the third metal wiring 626, but no portion of the MIM capacitor 634 is disposed in the third or the sixth dielectric layers 616 or 636, respectively, as is depicted in FIG. 6. As is also depicted in FIG. 6, a metal wiring 644 may be disposed above the MIM capacitor 634, but need not be coupled with the MIM capacitor 634.

Referring to both FIGS. 5 and 6, in an embodiment, at least a portion of the fourth metal wiring 532 or 632 is electrically coupled to one or more semiconductor devices, e.g., 504A or 604A, included in a logic circuit, and the MIM capacitor 534 or 634 is an embedded dynamic random access memory (eDRAM) capacitor. In an embodiment, semiconductor structure 500 or 600 further includes a plurality of etch-stop layers 550 or 650, respectively. As shown, an etch-stop layer may be disposed between each of the first (506 or 606), second (510 or 610), third (516 or 616), fourth (522 or 622), fifth (528 or 628) and sixth (536 or 636) dielectric layers.

In an embodiment, the MIM capacitor 534 or 634 is disposed in a trench 560 or 660, respectively, disposed in at least the fifth dielectric layer 528 or 628. In one such embodiment, the MIM capacitor 534 or 634 includes a cup-shaped metal plate 597/697 disposed along the bottom and sidewalls of the trench 560 or 660. A seventh dielectric layer 598/698 is disposed on and conformal with the cup-shaped metal plate 597/697. A trench-fill metal plate 599/699 is disposed on the seventh dielectric layer 598/698. The seventh dielectric layer 598/698 isolates the trench-fill metal plate 599/699 from the cup-shaped metal plate 597/697. In a specific embodiment, the sidewalls of the trench have a vertical or near-vertical profile, as is depicted for trench 660 of FIG. 6. In another specific embodiment, the sidewalls of the trench taper outward from the bottom to the top of the fifth dielectric layer 528 or 628, as is depicted for trench 560 of FIG. 5.

It is to be understood that, in other embodiments, additional single or multiple layers of dielectric layers and/or metal lines may be formed below or above MIM capacitors 534 or 634. Also, in other embodiments, single or multiple layers of dielectric layers and/or metal lines may be removed from below or above MIM capacitors 534 or 634. In other embodiments, MIM capacitors 534 or 634 are formed in additional one or more layers of dielectric layers. In one exemplary embodiment, in reference to FIG. 6 (although not shown), another portion of the MIM capacitor 634 is disposed in both the fourth 622 and sixth 636 dielectric layers, adjacent to the third 626 and fifth 640 metal wirings. In one such embodiment, however, no portion of the MIM capacitor is disposed in the third dielectric layer 616.

Figure 7:
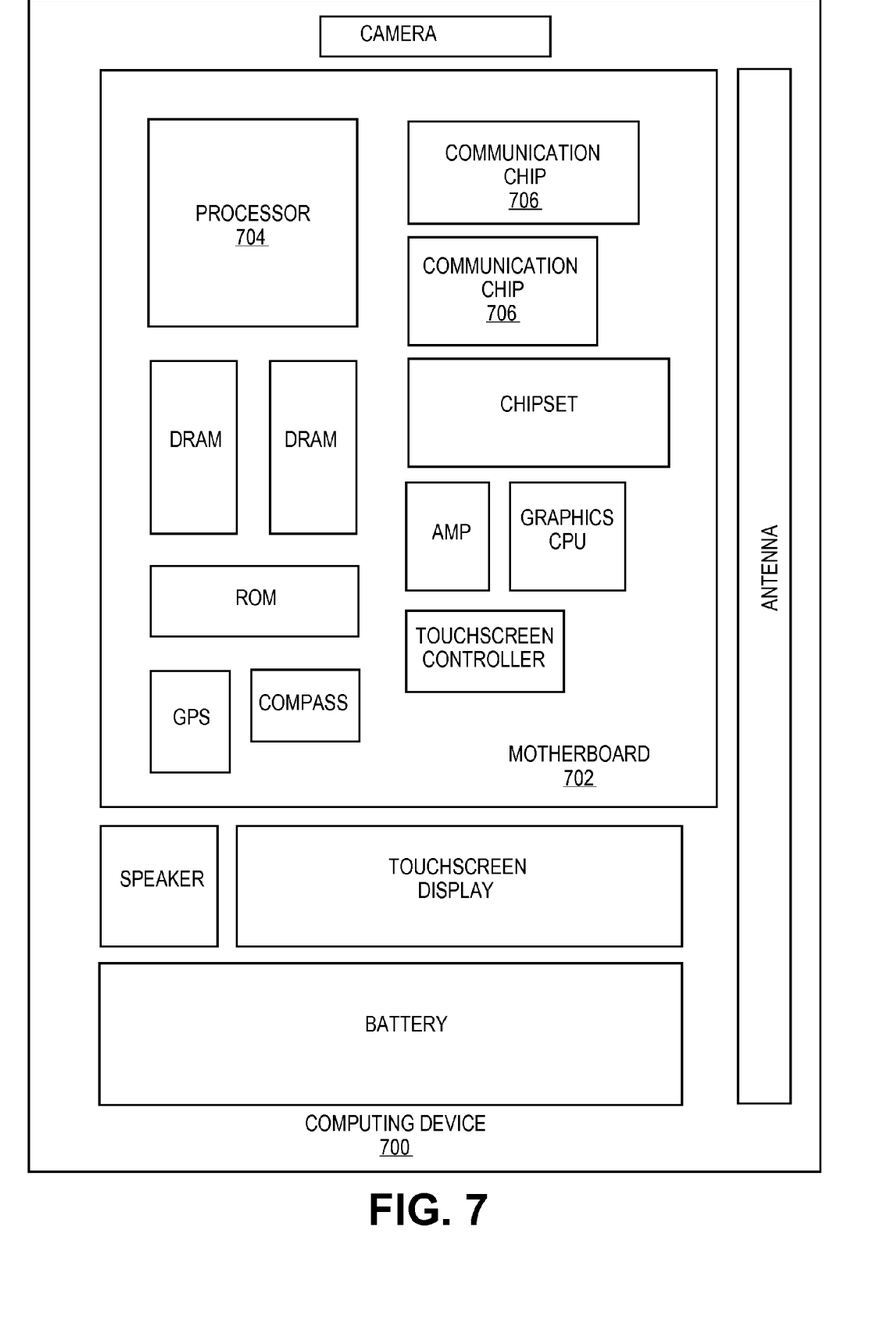
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM or eDRAM which may include a low leakage non-planar access transistor such as described in accordance with embodiments herein), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the invention, the integrated circuit die of the processor includes one or more devices, such as metal oxide semiconductor field effect transistors (MOS-FETs) built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FETs built in accordance with implementations of the invention.

In further implementations, another component housed within the computing device 700 may contain an integrated circuit die that includes one or more devices, such as MOS-FETs built in accordance with implementations of embodiments of the invention.

In various embodiments, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include low leakage non-planar access transistors for embedded dynamic random access memory (eDRAM) and methods of fabricating low leakage non-planar access transistors for eDRAM.

In an embodiment, a semiconductor device includes a semiconductor fin disposed above a substrate and including a narrow fin region disposed between two wide fin regions. A gate electrode stack is disposed conformal with the narrow fin region of the semiconductor fin, the gate electrode stack including a gate electrode disposed on a gate dielectric layer. The gate dielectric layer includes a lower layer and an upper layer, the lower layer composed of an oxide of the semiconductor fin. A pair of source/drain regions is included, each of the source/drain regions disposed in a corresponding one of the wide fin regions.

In one embodiment, the upper layer of the gate dielectric layer is an oxide of the semiconductor fin.

In one embodiment, the upper layer of the gate dielectric layer is a high-k dielectric layer.

In one embodiment, the gate electrode stack includes dielectric spacers, and a portion of the lower layer of the gate dielectric layer is disposed beneath the dielectric spacers.

In one embodiment, each of the source/drain regions includes an epitaxial region disposed on the corresponding one of the wide fin regions.

In one embodiment, the semiconductor device is a low leakage trigate transistor.

In one embodiment, the semiconductor device is an access transistor for a dynamic random access memory (DRAM) cell.

In an embodiment, a dynamic random access memory (DRAM) cell includes an access transistor. The access transistor includes a semiconductor fin, the semiconductor fin disposed above a substrate and including a narrow fin region disposed between two wide fin regions. A gate electrode stack is disposed conformal with the narrow fin region of the semiconductor fin. The access transistor also includes a pair of source/drain regions, each of the source drain regions disposed in a corresponding one of the wide fin regions. The DRAM cell also includes a capacitor structure coupled to the access transistor.

In one embodiment, the capacitor structure is a cup-shaped metal-insulator-metal (MIM) capacitor disposed in metal interconnect layers disposed above the access transistor.

In one embodiment, the access transistor is a low leakage trigate transistor.

In one embodiment, the gate electrode stack of the access transistor includes a gate electrode disposed on a gate dielectric layer. The gate dielectric layer includes a lower layer and an upper layer, the lower layer composed of an oxide of the semiconductor fin.

In one embodiment, the upper layer of the gate dielectric layer is an oxide of the semiconductor fin.

In one embodiment, the upper layer of the gate dielectric layer is a high-k dielectric layer.

In one embodiment, the gate electrode stack includes dielectric spacers, and a portion of the lower layer of the gate dielectric layer is disposed beneath the dielectric spacers.

In one embodiment, each of the source/drain regions of the access transistor includes an epitaxial region disposed on the corresponding one of the wide fin regions.

In an embodiment, a method of fabricating a semiconductor device involves forming a semiconductor fin above a substrate. The method also involves forming a gate electrode stack conformal with the semiconductor fin, the gate electrode stack including a dummy gate electrode formed on a first gate dielectric layer composed of an oxide of the semiconductor fin. The method also involves removing the dummy gate electrode of the gate electrode stack. The method also involves performing, in the presence of the first gate dielectric layer, a fin oxidation process to form a second gate dielectric layer below the first gate dielectric layer, the second gate dielectric layer composed of an oxide of the semiconductor fin. The method also involves forming a permanent gate electrode on the first gate dielectric layer.

In one embodiment, performing the fin oxidation process involves using a dry oxidation process.

In one embodiment, performing the fin oxidation process involves forming a narrow fin region beneath the gate electrode stack.

In an embodiment, a method of fabricating a semiconductor device involves forming a semiconductor fin above a substrate. The method also involves forming a gate electrode stack conformal with the semiconductor fin, the gate electrode stack including a dummy gate electrode formed on a dummy gate dielectric layer. The method also involves removing the dummy gate electrode and the dummy gate dielectric layer of the gate electrode stack. The method also involves forming a high-k gate dielectric layer. The method also involves performing, in the presence of the high-k gate dielectric layer, a fin oxidation process to form a second gate dielectric layer below the high-k gate dielectric layer, the second gate dielectric layer composed of an oxide of the semiconductor fin. The method also involves forming a permanent gate electrode on the high-k gate dielectric layer.

In one embodiment, performing the fin oxidation process involves using a dry oxidation process.

In one embodiment, performing the fin oxidation process involves forming a narrow fin region beneath the high-k gate dielectric layer.

What is claimed is:

1. A semiconductor device, comprising:
   a semiconductor fin disposed above a substrate and comprising a narrow fin region disposed between two wide fin regions;
   an isolation region laterally adjacent the semiconductor fin and having an upper surface below and upper surface of the semiconductor fin;
   a gate electrode stack disposed conformal with the narrow fin region of the semiconductor fin, the gate electrode stack comprising a gate electrode disposed on a gate dielectric layer comprising a lower layer and an upper layer, the lower layer comprising an oxide of the semiconductor fin, wherein the upper layer is over the isolation region but the lower layer is not over the isolation region; and
   a pair of source/drain regions, each of the source/drain regions disposed in a corresponding one of the wide fin regions.

2. The semiconductor device of claim 1, wherein the upper layer of the gate dielectric layer is a high-k dielectric layer.

3. The semiconductor device of claim 1, wherein the gate electrode stack comprises dielectric spacers, and wherein a portion of the lower layer of the gate dielectric layer is disposed beneath the dielectric spacers.

4. The semiconductor device of claim 1, wherein each of the source/drain regions comprises an epitaxial region disposed on the corresponding one of the wide fin regions.

5. The semiconductor device of claim 1, wherein the semiconductor device is a low leakage trigate transistor.

6. The semiconductor device of claim 1, wherein the semiconductor device is an access transistor for a dynamic random access memory (DRAM) cell.

7. A dynamic random access memory (DRAM) cell, comprising:
   an access transistor, comprising:
      a semiconductor fin, the semiconductor fin disposed above a substrate and comprising a narrow fin region disposed between two wide fin regions;
      an isolation region laterally adjacent the semiconductor fin and having an upper surface below and upper surface of the semiconductor fin;
      a gate electrode stack disposed conformal with the narrow fin region of the semiconductor fin, wherein the gate electrode stack of the access transistor comprises a gate electrode disposed on a gate dielectric layer comprising a lower layer and an upper layer, the lower layer comprising an oxide of the semiconductor fin, wherein the upper layer is over the isolation region but the lower layer is not over the isolation region; and
      a pair of source/drain regions, each of the source drain regions disposed in a corresponding one of the wide fin regions; and
   a capacitor structure coupled to the access transistor.

8. The DRAM cell of claim 7, wherein the capacitor structure is a cup-shaped metal-insulator-metal (MIM) capacitor disposed in metal interconnect layers disposed above the access transistor.

9. The DRAM cell of claim 7, wherein the access transistor is a low leakage trigate transistor.

10. The semiconductor device of claim 7, wherein the upper layer of the gate dielectric layer is a high-k dielectric layer.

11. The semiconductor device of claim 7, wherein the gate electrode stack comprises dielectric spacers, and wherein a portion of the lower layer of the gate dielectric layer is disposed beneath the dielectric spacers.

12. The semiconductor device of claim 7, wherein each of the source/drain regions of the access transistor comprises an epitaxial region disposed on the corresponding one of the wide fin regions.

13. A method of fabricating a semiconductor device, the method comprising:
   forming a semiconductor fin above a substrate;
   forming a gate electrode stack conformal with the semiconductor fin, the gate electrode stack comprising a dummy gate electrode formed on a first gate dielectric layer comprising an oxide of the semiconductor fin;
   removing the dummy gate electrode of the gate electrode stack; and, subsequently,
   performing, in the presence of the first gate dielectric layer, a fin oxidation process to form a second gate dielectric layer below the first gate dielectric layer, the second gate dielectric layer comprising an oxide of the semiconductor fin; and
   forming a permanent gate electrode on the first gate dielectric layer.

14. The method of claim 13, wherein performing the fin oxidation process comprises using a dry oxidation process.

15. The method of claim 13, wherein performing the fin oxidation process comprises forming a narrow fin region beneath the gate electrode stack.

16. A method of fabricating a semiconductor device, the method comprising:
   forming a semiconductor fin above a substrate;
   forming a gate electrode stack conformal with the semiconductor fin, the gate electrode stack comprising a dummy gate electrode formed on a dummy gate dielectric layer;
   removing the dummy gate electrode and the dummy gate dielectric layer of the gate electrode stack; and, subsequently,
   forming a high-k gate dielectric layer; and, subsequently,
   performing, in the presence of the high-k gate dielectric layer, a fin oxidation process to form a second gate dielectric layer below the high-k gate dielectric layer, the second gate dielectric layer comprising an oxide of the semiconductor fin; and forming a permanent gate electrode on the high-k gate dielectric layer.

17. The method of claim 16, wherein performing the fin oxidation process comprises using a dry oxidation process.

18. The method of claim 16, wherein performing the fin oxidation process comprises forming a narrow fin region beneath the high-k gate dielectric layer.

* * * * *

UNITED STATES PATENT AND TRADEMARK OFFICE
CERTIFICATE OF CORRECTION

PATENT NO. : 9,741,721 B2
APPLICATION NO. : 14/912890
DATED : August 22, 2017
INVENTOR(S) : Park et al.

Page 1 of 1

It is certified that error appears in the above-identified patent and that said Letters Patent is hereby corrected as shown below:

In the Claims

Claim 1, Column 15, Line 31, delete the second occurrence of "and" and insert --an--.
Claim 7, Column 15, Line 66, delete the second occurrence of "and" and insert --an--.

Signed and Sealed this
Fourth Day of December, 2018

Andrei Iancu
*Director of the United States Patent and Trademark Office*